United States Patent
Bertagnolli et al.

(10) Patent No.: US 6,583,464 B1
(45) Date of Patent: Jun. 24, 2003

(54) MEMORY CELL USING AMORPHOUS MATERIAL TO STABILIZE THE BOUNDARY FACE BETWEEN POLYCRYSTALLINE SEMICONDUCTOR MATERIAL OF A CAPACITOR AND MONOCRYSTALLINE SEMICONDUCTOR MATERIAL OF A TRANSISTOR

(75) Inventors: Emmerich Bertagnolli, München (DE); Gustav Beckmann, Radeburg (DE); Michael Bianco, München (DE); Helmut Klose, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/201,733

(22) Filed: Nov. 30, 1998

(30) Foreign Application Priority Data

Nov. 28, 1997 (DE) .......................... 197 52 968

(51) Int. Cl.$^7$ ............................................. H01L 27/108
(52) U.S. Cl. ....................... 257/306; 257/303; 257/304; 257/307; 257/301; 257/347; 257/353; 438/238; 438/243; 438/244; 438/388; 438/391
(58) Field of Search .................... 257/306, 307, 257/347, 353, 301, 303, 304; 438/238, 243, 244, 386, 391

(56) References Cited

U.S. PATENT DOCUMENTS

| | | | |
|---|---|---|---|
| 4,734,384 A | | 3/1988 | Tsuchiya |
| 4,801,988 A | * | 1/1989 | Kenney ................... 357/23.6 |
| 4,855,952 A | * | 8/1989 | Kiyosumi ................ 365/149 |
| 5,045,494 A | | 9/1991 | Choi et al. |
| 5,227,322 A | * | 7/1993 | Ko et al. .................. 437/47 |
| 5,338,955 A | * | 8/1994 | Tamura et al. ............ 257/306 |
| 5,360,758 A | * | 11/1994 | Bronner et al. ........... 437/52 |
| 5,395,786 A | * | 3/1995 | Hsu et al. ................. 437/52 |
| 5,422,294 A | * | 6/1995 | Noble, Jr. ................. 437/52 |
| 5,434,812 A | * | 7/1995 | Tseng ...................... 365/149 |
| 5,497,016 A | * | 3/1996 | Koh ........................ 257/306 |
| 5,543,348 A | | 8/1996 | Hammerl et al. |
| 5,744,853 A | * | 4/1998 | Quek et al. ............... 257/532 |
| 5,793,075 A | * | 8/1998 | Alsmeier et al. .......... 257/296 |
| 5,830,532 A | * | 11/1998 | Tang et al. ................ 427/255 |
| 5,959,326 A | * | 9/1999 | Aiso et al. ................ 257/306 |
| 5,973,349 A | * | 10/1999 | Ikemasu et al. ........... 257/307 |
| 6,249,017 B1 | * | 6/2001 | Togo ....................... 257/301 |

FOREIGN PATENT DOCUMENTS

| | | | | |
|---|---|---|---|---|
| JP | 406021390 | * | 6/1994 | ............. 257/306 |
| JP | 406163921 | * | 6/1994 | ............. 257/306 |

OTHER PUBLICATIONS

"Vertical Conducting Connection to a Poly–Si Trench in Si", IBM Technical Disclosure Bulletin, vol. 31, No. 12, May 1989, pp. 310–312.

"Process and Device Related Scaling Considerations for Polysilicon Emitter Bipolar Transistors", H. Schaber et al., IEDM 87, pp. 170–173.

* cited by examiner

*Primary Examiner*—Eddie Lee
*Assistant Examiner*—Edgardo Ortiz
(74) *Attorney, Agent, or Firm*—Laurence A. Greenberg; Werner H. Stemer; Gregory L. Mayback

(57) ABSTRACT

A memory cell array has memory cells in which there is an electrical connection between a polycrystalline semiconductor material of a capacitor electrode and a monocrystalline semiconductor region. Islands made of an amorphous material are disposed in a vicinity of the electrical connection between the polycrystalline semiconductor material and the monocrystalline semiconductor region. The islands are produced in particular by thermally breaking up an amorphous layer which has been formed by thermal oxidation. The memory cell array is in particular a DRAM array with a trench capacitor.

5 Claims, 2 Drawing Sheets

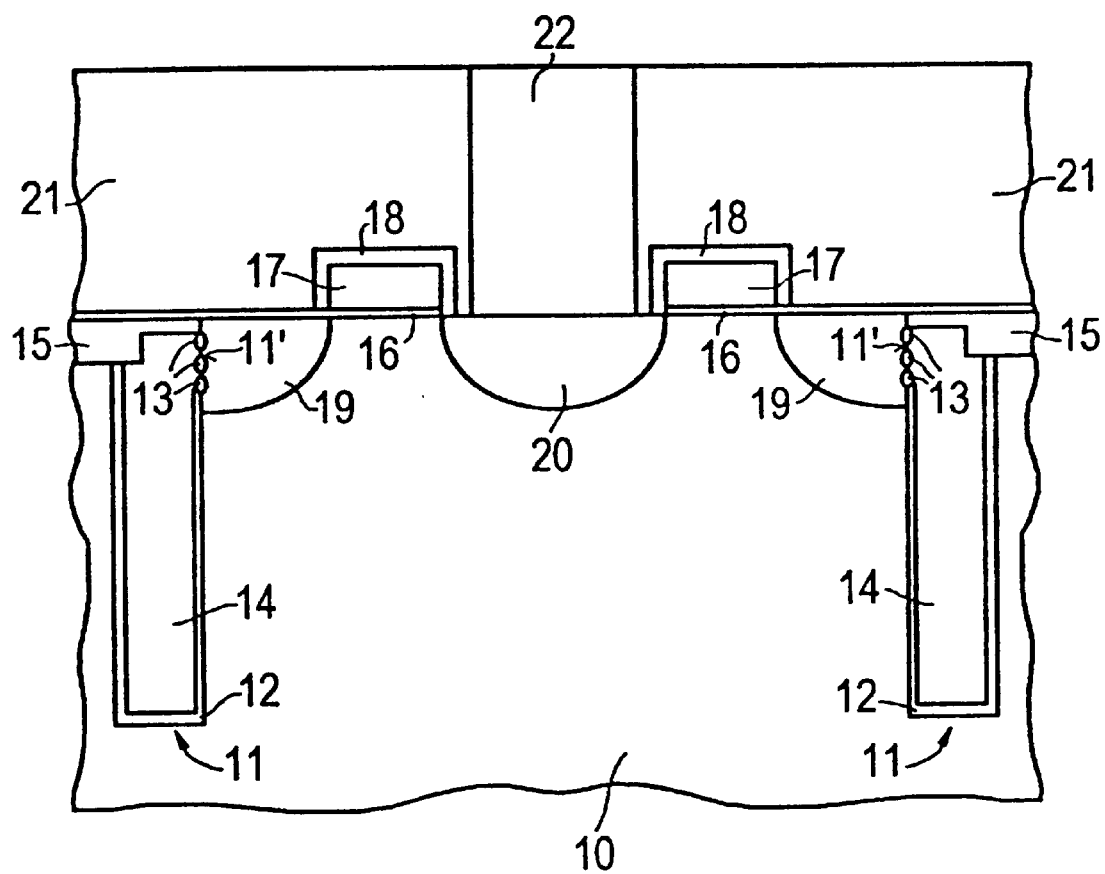

MEMORY CELL USING AMORPHOUS MATERIAL TO STABILIZE THE BOUNDARY FACE BETWEEN POLYCRYSTALLINE SEMICONDUCTOR MATERIAL OF A CAPACITOR AND MONOCRYSTALLINE SEMICONDUCTOR MATERIAL OF A TRANSISTOR

BACKGROUND OF THE INVENTION

Field of the Invention

In memory cell arrays, in particular in DRAM arrays, information is stored in the form of electrical charges in the individual memory cells. In many of such cells, the electrical charge is stored in memory capacitors. Here, the charge is retained in the memory capacitor for only a limited time. In DRAM arrays the retention time in a memory capacitor is approximately 2 to 3 seconds. In order to retain the stored information for longer, the information is periodically refreshed.

It has become apparent that individual memory cells in memory cell arrays have fluctuating retention times. Therefore, the retention time in the memory cells fluctuates between very small values, for example 10 milliseconds, and customary retention times of 2 to 3 seconds. This fault, which is also referred to as a variable retention time failure, is not predictable.

SUMMARY OF THE INVENTION

It is accordingly an object of the invention to provide a memory cell array and method for fabricating it which overcome the above-mentioned disadvantages of the prior art devices and methods of this general type, in which fluctuations in the retention time of a stored charge are reduced.

With the foregoing and other objects in view there is provided, in accordance with the invention, a memory cell array having memory cells, including: a capacitor electrode formed of a polycrystalline semiconductor material; a monocrystalline semiconductor region forming an electrical connection with the polycrystalline semiconductor material of the capacitor electrode; and islands formed of an amorphous material disposed in an area of the electrical connection between the polycrystalline semiconductor material and the monocrystalline semiconductor region.

In a memory cell array having memory cells in which there is an electrical connection between the polycrystalline semiconductor material of the capacitor electrode and the monocrystalline semiconductor region, islands made of amorphous material are disposed in the vicinity of the electrical connection between the polycrystalline semiconductor material and the monocrystalline semiconductor region. The islands made of amorphous material stabilize the boundary face between the monocrystalline semiconductor region and the polycrystalline semiconductor material of the capacitor electrode. This avoids the situation during the fabrication process, in particular during heat-treatment steps, in which the boundary face between the polycrystalline semiconductor material and the monocrystalline semiconductor region changes in such a way that on the one hand epitaxial growth emanating from the surface of the monocrystalline semiconductor region extends into the polycrystalline semiconductor material, and on the other hand granular growth emanating from the polycrystalline semiconductor material extends into the monocrystalline semiconductor region.

Preferably, the islands are disposed in the vicinity of the electrical connection in a planar configuration in an irregular grid.

The islands may have various shapes. In particular, the islands may be conical, ellipsoidal, rotationally ellipsoidal or of irregular shape. In particular, the various islands may have different shapes.

The invention is based on the following ideas: the variable retention time failure effect is observed in the memory cells in which there is an electrical connection between a monocrystalline semiconductor region and polycrystalline semiconductor material of a capacitor electrode. It is observed in particular in memory cells in which a selection transistor is disposed in a monocrystalline semiconductor substrate, the one source/drain region of the selection transistor is electrically connected to a capacitor electrode which is disposed in a trench and is made of polycrystalline semiconductor material. The variable retention time failure effect also occurs in memory cells with a stacked capacitor.

Investigations have shown that memory cells with a variable retention time failure effect in the monocrystalline semiconductor region exhibit crystal defects which emanate from the boundary face between the monocrystalline semiconductor region and the polycrystalline semiconductor material. The defects are considered to be a consequence of the unstable boundary faces between the polycrystalline semiconductor material and the monocrystalline semiconductor region.

According to the invention, islands made of amorphous material are disposed between the polycrystalline semiconductor material and the monocrystalline semiconductor region. The islands cause mechanical tension both on the surface of the monocrystalline semiconductor region and on the surface of the polycrystalline semiconductor material. In heat-treatment processes, the mechanical tension on the aforesaid surfaces prevents epitaxial growth emanating from the surface of the monocrystalline semiconductor region and granular growth emanating from the polycrystalline semiconductor material. As a result of the granular growth emanating from the polycrystalline semiconductor material, the crystal lattice defect that is present in the polycrystalline semiconductor material is transferred into the monocrystalline semiconductor region. The epitaxial growth emanating from the surface of the monocrystalline semiconductor region into the polycrystalline semiconductor material also brings about defects in the crystal in the monocrystalline semiconductor region. These defects, which may lead inter alia to dislocations, are avoided in the memory cell array according to the invention by the provision of the islands made of amorphous material.

At the same time, the islands made of amorphous material ensure that there is an electrical contact between the polycrystalline semiconductor material and the monocrystalline semiconductor region, since charge carriers can migrate through, between the islands made of amorphous material, from the polycrystalline semiconductor material into the monocrystalline semiconductor region. Furthermore, diffusion of doping material between the polycrystalline semiconductor material and the monocrystalline semiconductor region is possible.

Both insulating material, in particular $SiO_2$ or $Si_3N_4$, and conductive material, in particular tungsten or another metal with a high melting point, are suitable for the islands made of amorphous material.

The monocrystalline semiconductor region is in particular part of a semiconductor substrate, which has monocrystalline silicon at least in the vicinity of the electrical connection. A monocrystalline silicon wafer or a monocrystalline silicon layer of an SOI substrate are, inter alia, suitable as a semiconductor substrate.

The islands made of the amorphous material are preferably formed from oxide, in particular from silicon dioxide.

During the fabrication of the memory cell array, an amorphous layer of a predefined thickness is preferably applied to the surface of the monocrystalline semiconductor region in the vicinity of the electrical connection. Polycrystalline semiconductor material is applied on top of this. Here, the amorphous layer ensures that the polycrystalline semiconductor material grows in a polycrystalline fashion. In order to form the islands made of the amorphous material, preferably a heat-treatment step is carried out, during which step the amorphous layer breaks up into the islands.

Such a formation of oxide islands from a previously continuous oxide layer by a heat-treatment process is already known, in conjunction with bipolar transistors, from H. Schaber et al., IEDM 1987, pages 170 to 173. Such a heat-treatment step is used to break up the so-called native oxide layer or layer which arises when the substance is exposed to air and is formed uncontrollably on exposed silicon surfaces. The native oxide layer leads to increased resistance values between the emitter and the emitter connection on the surface of the emitter in bipolar transistors. The thermal breaking up of the layer of oxide that arises when the substance is exposed to air in the case of bipolar transistors improves the emitter resistance. However, there is no reference to the influence of islands made of amorphous material on the occurrence of defects in monocrystalline semiconductor material in H. Schaber et al., IEDM 1987, pages 170 to 173.

The monocrystalline semiconductor region is in particular a source/drain region of a selection transistor. The capacitor electrode is disposed in particular in a trench that is etched into a semiconductor substrate and is part of a so-called trench capacitor which, in addition to the capacitor electrode, has a capacitor dielectric and a part of the semiconductor substrate adjacent to the trench as counterelectrode. The capacitor electrode can also be disposed on the surface of the semiconductor substrate, in which selection transistors are disposed, and can be part of a stacked capacitor.

Preferably, the islands are disposed in such a way that the ratio of a distance between adjacent islands to the diameter of the islands is 10:1 at maximum, preferably between 2:1 and 1:1 at maximum. This configuration ensures that the tensions that are caused by the islands are distributed uniformly over the surface of the monocrystalline semiconductor region in the vicinity of the electrical connection, and thus prevent the formation of defects over the entire area.

Preferably, the islands have dimensions in the range between 0.5 and 50 nm parallel to the surface of the monocrystalline semiconductor region. The distances between adjacent islands are also 0.5 to 50 nm. They have a thickness between 0.5 nm and 15 nm perpendicular to the surface of the monocrystalline semiconductor region. The surface on which the islands are disposed is considered here in each case to be the surface of the monocrystalline semiconductor region. This surface may lie in particular in the upper area of a wall of a trench in which the capacitor electrode is disposed, and may be aligned perpendicular to a main face of a semiconductor substrate.

According to one preferred embodiment, the islands have dimensions in the range between 8 and 20 nm parallel to the surface of the monocrystalline semiconductor region. The distances between adjacent islands are approximately 12 nm. They have a thickness of approximately 8 nm perpendicular to the surface of the monocrystalline semiconductor region.

During the manufacture of the memory cell array, the amorphous layer is preferably formed by thermal oxidation. In order to ensure the controlled fabrication of the amorphous layer to a predefined thickness, a predefined temperature and time is maintained here in an oxidizing atmosphere. The oxidizing atmosphere here can be achieved by oxygen in a residual gas, oxygen in the atmosphere, in particular in air, or by a selectively added reaction gas with oxygen. In terms of the controllability of the thickness of the amorphous layer, it is advantageous here to carry out the thermal oxidization at a relatively low temperature, in particular in the range between 500 and 625° C.

The heat treatment to form the islands is preferably carried out in the range between 950 and 1150° C. Here, use is made of the fact that islands whose diameters and spacing can be predefined by the thickness of the amorphous layer are formed spontaneously at such high temperatures.

The islands made of amorphous material can be formed in another way, for example by depositing an amorphous layer that is structured with the aid of a statistically formed mask or with the aid of electron beam lithography.

Other features which are considered as characteristic for the invention are set forth in the appended claims.

Although the invention is illustrated and described herein as embodied in a memory cell array and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a fragmentary, sectional view though a memory cell array having memory cells that each have a selection transistor and a trench capacitor.

DESCRIPTION OF THE PREFERRED EMBODIMENTS

Figure 1:
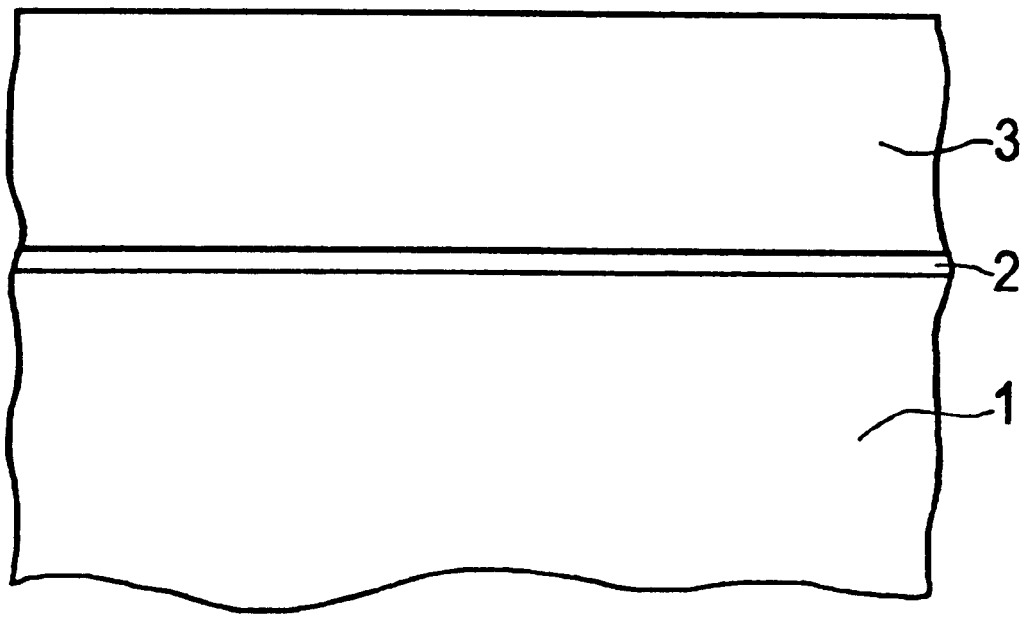
FIG. 1 is a diagrammatic, fragmentary, sectional view of a monocrystalline semiconductor region having an amorphous layer and a polycrystalline semiconductor layer according to the invention.

In all the figures of the drawing, sub-features and integral parts that correspond to one another bear the same reference symbol in each case. Referring now to the figures of the drawing in detail and first, particularly, to FIG. 1 thereof, there is shown an amorphous layer 2 formed on a surface of a monocrystalline semiconductor region 1. The monocrystalline semiconductor region 1 is part of a monocrystalline silicon wafer or of a monocrystalline silicon layer which is disposed on the surface of a buried, insulating layer of an SOI substrate, and a polysilicon layer 3 is applied on the amorphous layer 2. The amorphous layer 2 is formed from $SiO_2$ in a controlled fashion to a thickness of 0.5 nm.

In order to form the amorphous layer 2, the surface of the monocrystalline semiconductor region 1 is first cleaned by etching with hydrofluoric acid. In the process, native oxide (oxide which arises when the substance is exposed to air) that has grown on the exposed semiconductor surface in an unintentional and uncontrolled way, is completely removed. Then, the monocrystalline semiconductor region 1 with the surface that has been exposed by etching is placed in an oven. When it is placed in the oven, the bared semiconductor surface is exposed to the ambient air, during which process native oxides form again. The thickness of the native oxide that is formed is dependent on the doping of the monocrystalline semiconductor region 1, the orientation of the crystals, and the duration of the process of loading the oven. If the doping of the monocrystalline semiconductor region 1 is $10^{17}$ $cm^{-3}$ and the loading of the oven takes one hour, given a <100> orientation of the monocrystalline semiconductor region 1, native oxide is formed with a layer thickness of 0.3 nm. The materials are placed in the oven at the lowest possible temperature of 500° C.

After the oven has been loaded, the oven is closed and the amorphous layer 2 is formed to a final thickness by precise temperature control and time duration. At 500° C. and with six minutes of oxidation time, the amorphous layer 2 forms with an overall thickness of 0.5 nm. Part of the amorphous layer 2 is also the native oxide that is formed during the loading of the oven.

The ambient atmosphere, which remains after the oven has been closed and which contains oxygen, serves as an oxidizing atmosphere in the oven during the formation of the amorphous layer 2.

After the amorphous layer 2 has been formed to the predefined thickness, the oxidizing atmosphere in the oven is pumped out. The oven is brought to a deposition temperature of 625° C. that is necessary for the deposition of the polysilicon layer 3. The deposition is carried out using a process gas containing silicon, for example silane. The process gas for the deposition contains no oxygen so that the thickness of the amorphous layer 2 remains unchanged. The polysilicon layer 3 is deposited to a thickness of 300 nm.

By carrying out heat treatment in the temperature range between 950° C. and 1150° C. the amorphous layer 2 which is continuous up to that point is broken up and islands 2' made of amorphous material are formed from it. The islands 2' are disposed in a planar configuration between the surface of the monocrystalline semiconductor region 1 and the polysilicon layer 3. The individual islands 2' are conical, ellipsoidal or of irregular shape. In addition, the configuration has unequal coverage.

If the amorphous layer is formed to a layer thickness of 0.5 nm and the heat-treatment step is carried out at 1100° C. for five seconds, islands 2' are formed which are essentially ellipsoidal and have the dimensions 8 nm to 20 nm parallel to the surface of the monocrystalline semiconductor region 1. The distance between adjacent regions 2' is approximately 12 nm. The thickness of the islands 2' perpendicular to the surface of the monocrystalline region 1 is approximately 8 nm. This configuration of the islands 2' ensures, in the first instance, that there is a thermodynamically stable boundary face between the monocrystalline semiconductor region 1 and the polysilicon layer 3. In the second instance, it permits an electrical connection with a defined electrical contact between the polysilicon layer 3 and the monocrystalline semiconductor region 1.

Between the deposition of the polysilicon layer 3 and the heat-treatment step to form the islands 2' there are, as a rule, a plurality of other process steps. The heat-treatment step to form the islands 2' may, in particular, be carried out simultaneously with a heat-treatment step for activating and/or diffusing doping substances.

The oxidizing atmosphere for forming the amorphous layer 2 can also be formed by selectively feeding in oxygen. An oven with a vacuum interlock, into which oxygen is fed after the monocrystalline semiconductor region 1 has been introduced, may, in particular, be used for this. In addition, it is possible to use an oven in which the surface of the monocrystalline semiconductor region 1 is exposed by etching in order to remove the native oxide that has grown in an uncontrolled fashion. By selectively feeding in oxygen, the amorphous layer 2 is then grown in a controlled fashion. A suitable oven is either an oven in which the formation of the amorphous layer 2 and of the polysilicon layer 3 take place in one and the same chamber or an oven having a plurality of chambers. The amorphous layer 2 can also be formed at the same temperature at which the polysilicon layer 3 is deposited. In this case, however, it is necessary to precisely control the oxidization period and the supply of oxygen.

In order to fabricate a memory cell array having memory cells which each have a trench capacitor and a selection transistor, trenches 11 with a depth of 8 mm are formed in a p-doped silicon substrate 10 with <100> orientation by masked anisotropic etching.

A capacitor dielectric 12 is formed on the surface of the trenches 11. The capacitor dielectric 12 is formed as a triple layer from a first $SiO_2$ layer, an $Si_3N_4$ layer and a second $SiO_2$ layer to an overall thickness of 5 nm.

Figure 2:
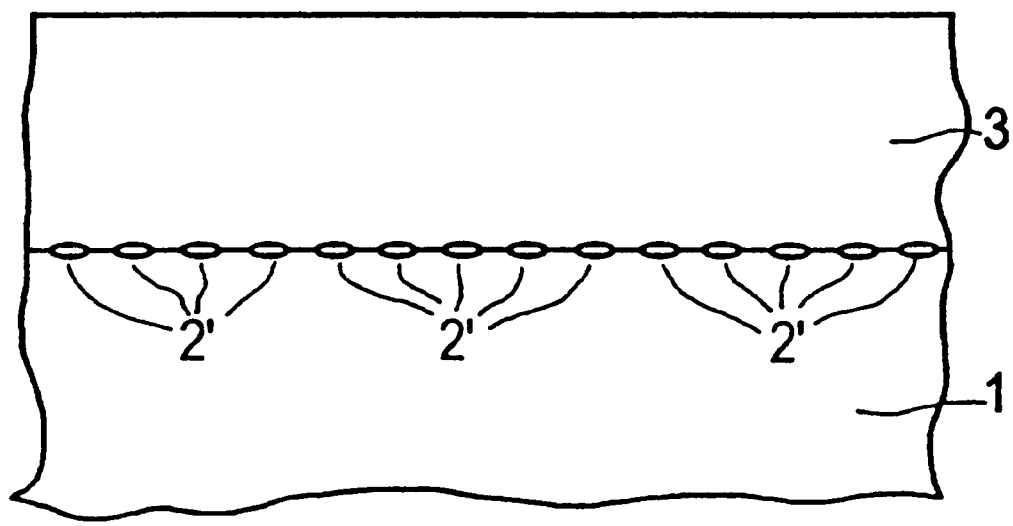
FIG. 2 is a fragmentary, sectional view of the monocrystalline semiconductor region having the polycrystalline semiconductor layer after islands have been formed by heat treatment.

The capacitor dielectric 12 is respectively removed in the upper area of an edge 11' of the trenches 11 so that the surface of the monocrystalline silicon substrate 10 is exposed in an upper area of the edge 11'. On the exposed surface of the monocrystalline silicon substrate 10 in the upper area of the edge 11', an amorphous layer made of $SiO_2$ is produced in a controlled fashion to a thickness of 0.5 nm, as explained with reference to FIGS. 1 and 2. From the amorphous layer islands 13 made of the amorphous material are formed as the process continues. The comments made with respect to FIGS. 1 and 2 apply to the formation of the amorphous layer made of $SiO_2$.

By depositing a doped polysilicon layer, subsequent capacitor electrodes 14 made of polysilicon are formed and essentially fill the trenches 11. The. amorphous layer which has grown to a controlled thickness is disposed in the upper part of the edge 11' between the capacitor electrode 14 made of polycrystalline silicon and the monocrystalline silicon substrate 10. In this way, the polysilicon layer that forms the capacitor electrode 14 grows in a controlled polycrystalline fashion.

Subsequently, using a LOCOS process or a shallow trench isolation (STI) process, an isolation structure 15 is formed which respectively surrounds the upper part of the edges 11' of two adjacent trenches 11.

The main area of the monocrystalline silicon substrate 10 is subsequently provided with a gate dielectric 16 which is formed by thermal oxidation to a layer thickness of 12.5 nm.

Subsequently, word lines 17 are produced, two word lines 17 are disposed between two adjacent trenches 11. The word lines 17 are surrounded with a word line isolation layer 18, made of $SiO_2$ for example.

By implantation with phosphorus and/or arsenic, a source/drain region 19 is respectively formed between the word lines 17 and the adjacent trench 11, and a common source/drain region 20 is respectively formed between the two word lines 17.

A heat-treatment step at 1100° C. follows for five seconds, during which, on the one hand, the doping substances of the source/drain regions 19, 20 are actuated and diffused and during which, on the other hand, the islands 13 made of amorphous material are formed by breaking up the amorphous layer which is disposed on the edges 11'. The islands 13 made of amorphous material are essentially ellipsoidal and have dimensions between 8 nm and 20 nm parallel to the edge 11'. They have a thickness of approximately 8 nm perpendicular to the edge 11'. The distance between adjacent islands 13 is approximately 12 nm. The islands 13 have the effect that the boundary face between the capacitor electrode 14 and the monocrystalline source/drain region 19 in the silicon substrate 10 is stable, and in particular no defects are produced emanating from this boundary face into the source/drain region 19, 20 and the silicon substrate 10. The illustration of the islands 13 in FIG. 3 is diagrammatic and highly enlarged. In reality, the illustrated section has a plurality of islands 13.

The memory cell array is subsequently completed in a known fashion. In particular, a passivation layer 21 is deposited, in which bit-line contacts: 22 to the common source/drain region 20 are produced.

Each memory cell in the memory cell array has a trench capacitor and a selection transistor. The trench capacitor is respectively formed from the capacitor electrode 14, the capacitor dielectric 12 and the surrounding substrate material 10, which is p-doped. The selection transistor is respectively formed from the source/drain regions 19, 20 and the gate dielectric 16 disposed between them and the corresponding word line 17. The capacitor electrode 14 is electrically connected to one of the source/drain regions 19, where islands 13 made of the amorphous material are disposed in the vicinity of the electrical connection.

We claim:

1. A memory cell array having memory cells, comprising:
    a capacitor electrode formed of a polycrystalline semiconductor material;
    a monocrystalline semiconductor region forming an electrical connection with said polycrystalline semiconductor material of said capacitor electrode, said monocrystalline semiconductor region and said polycrystalline semiconductor material of said capacitor electrode having a common boundary surface; and
    a plurality of islands formed of an amorphous material; and
    a plurality of electrical connection regions providing said electrical connection between said polycrystalline semiconductor material and said monocrystalline semiconductor region, said plurality of electrical connection regions and said plurality of islands alternatingly disposed in a direction parallel to said surface of said monocrystalline semiconductor region.

2. The memory cell array according to claim 1, wherein said islands each have a diameter and are disposed such that a ratio of a distance between adjacent islands to said diameter of said islands is 10:1 at a maximum.

3. The memory cell array according to claim 1, including a semiconductor substrate, said monocrystalline semiconductor region being a source/drain region of a selection transistor disposed in said semiconductor substrate, and said capacitor electrode being part of a memory capacitor configured as a trench capacitor.

4. The memory cell array according to claim 1, wherein said monocrystalline semiconductor region is formed of monocrystalline silicon at least in an area adjacent said plurality of electrical connection regions, said capacitor electrode is formed of polycrystalline silicon at least in an area adjacent said plurality of electrical connection regions, and said plurality of islands are formed of $SiO_2$.

5. The memory cell array according to claim 1, wherein:
    said islands each have a dimension in a range of between 0.5 and 50 nm in said direction parallel to said surface of said monocrystalline semiconductor region;
    distances between adjacent islands are between 0.5 and 50 nm; and
    said islands have a thickness of 0.5 nm to 15 nm in a direction perpendicular to said surface of said monocrystalline semiconductor region.

* * * * *